(12) United States Patent
Ding et al.

(10) Patent No.: US 8,643,191 B2
(45) Date of Patent: Feb. 4, 2014

(54) ON-CHIP RADIAL CAVITY POWER DIVIDER/COMBINER

(75) Inventors: Hanyi Ding, Colchester, VT (US); Pinping Sun, Essex Junction, VT (US); Guoan Wang, Lexington, SC (US); Wayne H. Woods, Jr., Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/358,792

(22) Filed: Jan. 26, 2012

(65) Prior Publication Data

US 2013/0193584 A1    Aug. 1, 2013

(51) Int. Cl.
*H01L 23/48* (2006.01)
*H01L 23/52* (2006.01)
*H01L 29/40* (2006.01)

(52) U.S. Cl.
USPC ........... 257/774; 257/621; 257/692; 438/637; 438/667

(58) Field of Classification Search
USPC ............... 257/774, 621, 692, 723; 438/667
See application file for complete search history.

(56) References Cited

U.S. PATENT DOCUMENTS

| | | | |
|---|---|---|---|
| 4,926,145 A | 5/1990 | Flam et al. | |
| 7,242,266 B2 | 7/2007 | Peterson | |
| 7,741,722 B2 | 6/2010 | Andry et al. | |
| 8,035,198 B2 | 10/2011 | Ding et al. | |
| 2004/0212073 A1* | 10/2004 | Divakar et al. | 257/698 |
| 2010/0140749 A1* | 6/2010 | Kuo | 257/621 |
| 2011/0018657 A1 | 1/2011 | Cheng et al. | |
| 2011/0024916 A1* | 2/2011 | Marimuthu et al. | 257/774 |
| 2011/0043301 A1 | 2/2011 | Huettner | |
| 2011/0049676 A1 | 3/2011 | Ding et al. | |
| 2011/0089531 A1 | 4/2011 | Hillman et al. | |
| 2011/0260329 A1* | 10/2011 | Seo | 257/774 |
| 2011/0272818 A1* | 11/2011 | Jeong | 257/774 |

OTHER PUBLICATIONS

Song, et al., "Eight-Way Substrate Integrated Waveguide Power Divider with Low Insertion Loss," IEEE Transactions on Microwave Theory and Techniques, vol. 56, No. 6, Jun. 2008, pp. 1473-1477.*
Woods, et al., "Novel On-Chip Through—Silicon—via Wilkinson Power Divider," IEEE, 2010 Electronic Components and Technology Conference, 2010, pp. 524-529.*
Woods, et al., "Novel On-Chip Through-Silicon-via Wilkinson Power Divider," IEEE, 2010 Electronic Components and Technology Conference, 2010, pp. 524-529.

* cited by examiner

*Primary Examiner* — Phuc Dang
(74) *Attorney, Agent, or Firm* — Gibb & Riley, LLC; David A. Cain, Esq.

(57) ABSTRACT

Disclosed is a chip with a power divider/combiner, a module incorporating the chip and associated methods. The divider/combiner comprises first and second metal layers on opposite sides of a substrate. Interconnects extend through the substrate and comprise: a first interconnect, second interconnects annularly arranged about the first interconnect and third interconnects annularly arranged about the second interconnects. Each interconnect comprises one or more through silicon vias lined/filled with a conductor. For a power divider, an opening in the first metal layer at the first interconnect comprises an input port for receiving power and openings in the first or second metal layer at the second interconnects comprise output ports for applying power to other devices. For a power combiner, openings in the first or second metal layer at the second interconnects comprise the input ports and an opening in the first metal layer at the first interconnect comprises an output port.

20 Claims, 16 Drawing Sheets

ON-CHIP RADIAL CAVITY POWER DIVIDER/COMBINER

BACKGROUND

1. Field of the Invention

The present disclosure relates to on-chip power divider/combiners and, more particularly, to embodiments of an integrated circuit chip with a radial cavity power divider/combiner, a multiple chip module (MCM) incorporating such a chip and methods of forming such a chip and MCM.

2. Description of the Related Art

With device size scaling, entire systems (e.g., communication systems, radar systems, sensor systems, etc.) are being implemented on a multiple chip module (MCM), on a single integrated circuit (IC) chip, or on a three-dimensional integrated circuit (3-D IC) chip, which has multiple layers of active devices that are integrated both horizontally and vertically. Such systems often require the incorporation of power dividing (i.e., splitting) and/or combining devices for millimeter wave applications. Those skilled in the art will recognize that millimeter wave applications refer to applications implemented at the radio frequency (RF) bands of 30-300 GHz. For example, in a phased array sensor system or a phased array radar system, a single relatively high RF signal line (e.g., 60 GHz) is split to provide power to multiple (e.g., 8) phase shifters. Unfortunately, existing on-chip power dividing and/or combining solutions for such millimeter wave applications tend to exhibit a relatively high amount of insertion loss. Thus, there is a need in the art for a more efficient on-chip power dividing and/or combining device (i.e., an on-chip power divider/combiner) that exhibits low insertion loss and, thereby allows for better system performance.

SUMMARY

Disclosed herein are embodiments of an integrated circuit chip with a radial cavity power divider/combiner that can be used for millimeter wave applications. The power divider/combiner can comprise first and second metal layers on opposite sides of a substrate. Interconnects can extend vertically through the substrate and can comprise: a first interconnect, a set of second interconnects annularly arranged about the first interconnect and a set of third interconnects annularly arranged about the set of second interconnects. Each interconnect can comprise one or more through silicon vias (TSVs) lined and/or filled with a conductor. For a power divider, a first opening in the first metal layer at the first interconnect can comprise an input port for receiving power from a signal line (e.g., a radio frequency (RF) signal line) and second openings either in the first metal layer or in the second metal layer at the second interconnects can comprise output ports for applying power, once divided, to a plurality of other devices. For a power combiner, second openings in the first metal layer or in the second metal layer at the second interconnects can comprise input ports for receiving power from a plurality of signal lines (e.g., a plurality of RF signal lines) and a first opening in the first metal layer at the first interconnect can comprise an output port for applying power, once combined, to another device. In one embodiment, this integrated circuit chip can comprise a three-dimensional integrated circuit (3-D IC) chip wherein the radial cavity power divider/combiner is integrated vertically and/or horizontally with another device or devices. In another embodiment, the integrated circuit chip can be incorporated into a multiple chip module (MCM) so that the radial cavity power divider/combiner can be integrated vertically and/or horizontally with another device or devices. Also disclosed herein are associated method embodiments for forming the above-described integrated circuit chip, including a 3-D integrated circuit chip, and for forming a MCM incorporating such an integrated circuit chip.

More particularly, disclosed herein are embodiments of an integrated circuit chip. This chip can comprise a substrate, having a first side and a second side opposite the first side, and comprising at least a semiconductor layer.

The integrated circuit chip can further comprise a device comprising either a radial cavity power divider or radial cavity power combiner (i.e., a radial cavity divider/combiner). The radial cavity divider/combiner can comprise a first metal layer on the first side of the substrate and a second metal layer on the second side of the substrate.

Additionally, the radial cavity power divider/combiner can comprise a plurality of interconnects that extend vertically through the substrate from the first metal layer to the second metal layer. These interconnects can comprise a first interconnect, a set of second interconnects annularly arranged about the first interconnect, and a set of third interconnects annularly arranged about the set of second interconnects. Each interconnect can comprise one or more through silicon vias (TSV) lined and/or filled with a conductor. It should be noted that the shapes of the TSVs (e.g., round or rectangular) will vary depending upon the TSV processing technique used.

In any case, the first metal layer can have a first opening at (i.e., aligned with) the first interconnect and either the first metal layer or the second metal layer can have second openings at (i.e., aligned with) the second interconnects. For a power divider, the first opening can comprise an input port for receiving power from a signal line (e.g., a radio frequency (RF) signal line) and the second openings can comprise output ports for applying the power, once divided, to a plurality of other devices. For a power combiner, the second openings can comprise input ports for receiving power from a plurality of signal lines (e.g., a plurality of RF signal lines) and the first opening can comprise an output port for applying power, once combined, to another device.

In one embodiment, this integrated circuit chip can comprise a three-dimensional integrated circuit (3-D IC) chip wherein the radial cavity power divider/combiner is integrated vertically and/or horizontally with another device or devices. Alternatively, this integrated circuit chip can comprise a single layer integrated circuit chip incorporated into a multiple chip module to allow the radial cavity power divider/combiner to be integrated vertically and/or horizontally with another device or devices. In other words, also disclosed herein are embodiments of a multiple chip module (MCM) that incorporates the above-described integrated circuit chip. Specifically, the MCM can comprise a first integrated circuit chip. The first integrated circuit chip can comprise a substrate and a first device on the substrate. This first device can comprise a radial cavity power divider or a radial cavity power combiner (i.e., a radial cavity divider/combiner), as described in detail above.

The MCM can further comprise a second integrated circuit chip stacked adjacent to (i.e., above or below) the first integrated circuit chip. The second integrated circuit chip can comprise one or more second devices that are electrically connected to and receive power from the first device (i.e., from the radial cavity divider/combiner).

For example, in one embodiment, a signal line (e.g., a radio frequency (RF) signal line) can be electrically connected to the first interconnect at the first opening (i.e., at an input port)

in the first metal layer of a power divider. Additionally, the second integrated circuit chip can comprise a plurality of second devices electrically connected to the second interconnects at the second openings (i.e., at output ports) either in the first metal layer or the second metal layer, depending upon the power divider configuration. In this case, the first device can receive power from the signal line at the input port and can divide the power for application to the second devices at the output ports.

In another embodiment, a plurality of signal lines (e.g., a plurality of radio frequency (RF) signal lines) can be electrically connected to the second interconnects at the second openings (i.e., at input ports) in either the first metal layer or the second metal layer of a power combiner. The second integrated circuit chip can comprise a single second device electrically connected to the first interconnect at the first opening (i.e., at an output port) in the first metal layer. In this case, the first device receives power from the signal lines at the input ports and can combine the power for application to the second device at the output port.

Also disclosed herein are method embodiments for forming the above-described integrated circuit chip, including a single layer integrated circuit chip or a three-dimensional (3-D) integrated circuit chip, with a radial cavity power divider/combiner and for forming a multiple chip module (MCM) incorporating such a chip.

The method embodiments can comprise providing a substrate, having a first side and a second side opposite the first side. This substrate can comprise at least a semiconductor layer. A first integrated circuit chip, e.g., a single layer integrated circuit chip or a three-dimensional integrated circuit (3-D IC) chip, can be formed on the substrate such it comprises a first device and, particularly, such that it comprises a radial cavity power divider/combiner, as discussed in detail above.

The method embodiments can further comprise incorporating the first integrated circuit chip into a multiple chip module such that it is stacked adjacent to (i.e., above or below) a second integrated circuit chip and further such that one or more second devices on the second integrated circuit chip are electrically connected to and receive power from the first device (i.e., from the radial cavity divider/combiner).

For example, in one embodiment, the method can comprise electrically connecting a signal line to the first interconnect at the first opening (i.e., at an input port) in the first metal layer of the first device. Additionally, in this embodiment, the method can comprise electrically connecting a plurality of second devices on the second integrated circuit chip to the second interconnects at the second openings (i.e., at output ports) that are either in the first metal layer or the second metal layer of the first device. Thus, in this case, the first device can receive power from the signal line at the input port and can divide the power for application to the second devices at the output ports.

In another embodiment, the method can comprise electrically connecting a plurality of signal lines to the second interconnects at the second openings (i.e., at the input ports) in either the first metal layer or the second metal layer of the first device. Additionally, the method can comprise electrically connecting a single second device on the second integrated circuit chip to the first interconnect at the first opening (i.e., at an output port) in the first metal layer of the first device. Thus, in this case, the first device can receive power from the signal lines at the input ports and can combine the power for application to the second device at the output port.

BRIEF DESCRIPTION OF THE DRAWINGS

The embodiments disclosed herein will be better understood from the following detailed description with reference to the drawings, which are not necessarily drawn to scale and in which.

DETAILED DESCRIPTION

Figure 1:
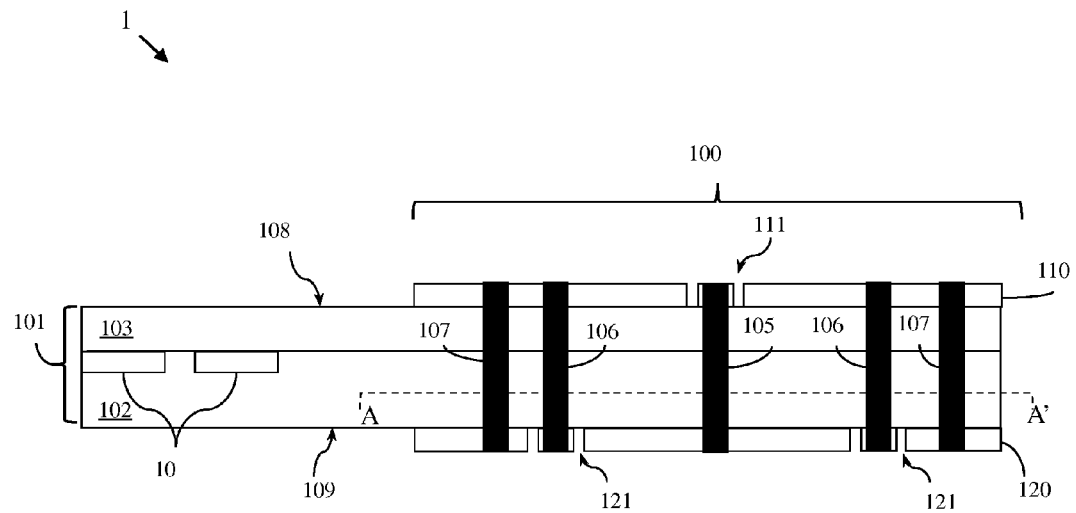
FIG. 1 is a cross-section diagram illustrating an embodiment of an integrated circuit chip with a radial cavity power divider/combiner.

As mentioned above, with device size scaling, entire systems (e.g., communication systems, radar systems, sensor systems, etc.) are being implemented on a multiple chip module (MCM), on a single integrated circuit (IC) chip, or on a three-dimensional integrated circuit (3D IC) chip, which has multiple layers of active device that are integrated both horizontally and vertically. Such systems often require the incorporation of power dividing (i.e., splitting) and/or combining devices for millimeter wave applications. Those skilled in the art will recognize that millimeter wave applications refer to applications implemented at the radio frequency (RF) bands of 30-300 GHz. For example, in a phased array sensor system or a phased array radar system, a single relatively high RF signal line (e.g., 60 GHz) is split to provide power to multiple (e.g., 8) phase shifters. Unfortunately, existing on-chip power dividing and/or combining solutions for such millimeter wave applications tend to exhibit a relatively high amount of insertion loss (e.g., see the Wilkinson power divider disclosed in U.S. Patent Application Publication No. 2011/0049676 of Ding et al., published on Mar. 3, 2011, assigned to International Business Machines, Inc. and incorporated herein by reference). Thus, there is a need in the art for a more efficient on-chip power dividing and/or combining device (i.e., an on-chip power divider/combiner) that exhibits low insertion loss and, thereby allows for better system performance.

In view of the foregoing, disclosed herein are embodiments of an integrated circuit chip with a radial cavity power divider/combiner (i.e., an on-chip radial cavity power divider/combiner) that can be used for millimeter wave applications and that exhibits low insertion loss and, thereby allows for better system performance. The power divider/combiner can comprise first and second metal layers on opposite sides of a substrate. Interconnects can extend vertically through the substrate and can comprise: a first interconnect, a set of second interconnects annularly arranged about the first interconnect and a set of third interconnects annularly arranged about the set of second interconnects. Each interconnect can comprise one or more through silicon vias (TSVs) that are lined and/or filled with a conductor. For a power divider, a first opening in the first metal layer at a first interconnect can comprise an input port for receiving power from a signal line (e.g., a radio frequency (RF) signal line) and second openings in either the first metal layer or the second metal layer at the second interconnects can comprise output ports for applying the power, once divided, to a plurality of other devices. For a power combiner, second openings in either the first metal layer or the second metal layer at the second interconnects can comprise input ports for receiving power from a plurality of signal lines (e.g., a plurality of RF signal lines) and a first opening in the first metal layer at the first interconnect can comprise an output port for applying power, once combined, to another device. In one embodiment, this integrated circuit chip can comprise a three-dimensional integrated circuit (3-D IC) chip wherein the radial cavity power divider/combiner is integrated vertically and/or horizontally with another device or devices. In another embodiment, the integrated circuit chip can be incorporated into a multiple chip module (MCM) so that the radial cavity power divider/combiner can be integrated vertically and/or horizontally with another device or devices. Also disclosed herein are associated method embodiments for forming the above-described integrated circuit chip, including a 3-D integrated circuit chip, and for forming a MCM incorporating such an integrated circuit chip.

Figure 2:
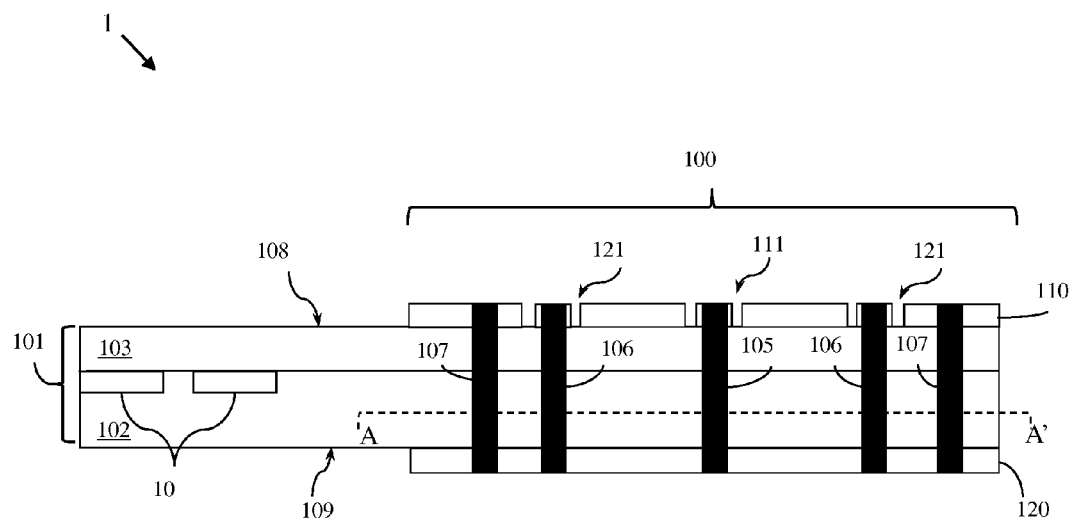
FIG. 2 is a cross-section diagram illustrating another embodiment of an integrated circuit chip with a radial cavity power divider/combiner.

More particularly, referring to FIGS. 1 and 2, disclosed herein are embodiments of an integrated circuit chip 1. This chip 1 can comprise a substrate 101, which can have a first side 108 and a second side 109 opposite the first side. The substrate 101 can comprise at least one semiconductor layer 102. For example, the substrate 101 can comprise a bulk semiconductor layer (e.g., a bulk silicon layer or any other bulk semiconductor layer), as shown. Alternatively, the substrate 101 can comprise a semiconductor-on-insulator (SOI) structure. Those skilled in the art will recognize that a semiconductor-on-insulator (SOI) structure can comprise an insulator layer (e.g., a buried oxide or other suitable insulator layer) between two semiconductor layers (e.g., between two silicon layers or between any other suitable semiconductor layers). Additionally, the substrate 101 can comprise one or more dielectric layers 103 (e.g., interlayer dielectrics, such as silicon dioxide ($SiO_2$), silicon nitride (SiN), borophosphosilicate glass (BPSG), etc.) at one or both sides 108, 109.

The chip 1 can further comprise a device 100 and a plurality of additional devices 10 (e.g., diodes, field effect transistors, bipolar junction transistors, resistors, capacitors, inductors, etc.) positioned laterally adjacent to the device 100 within and/or above the semiconductor layer 102.

The device 100 can comprise a radial cavity power divider or a radial cavity power combiner (i.e., a radial cavity divider/combiner) that can, for example, be used for millimeter wave applications. As mentioned above, millimeter wave applications refer to applications implemented at the radio frequency (RF) bands from 30-300 GHz. For illustration purposes, the embodiments of the chip 1 are described herein with reference to 60 Ghz applications, which are currently used in many communication systems, radar systems, sensor systems, etc. While radial cavity power divider/combiner structures and the operation thereof are generally known in the art, such structures are typically discrete structures formed using a bulk conductive cavity or using standard printed circuit board processing technique and not actually incorporated into an integrated circuit chip, as disclosed herein.

The radial cavity divider/combiner 100 can comprise a first metal layer 110 on one side of the substrate 101 (e.g., on first side 108) and a second metal layer 120 on the opposite side of the substrate 101 (e.g., on second side 109). For example, in one embodiment, the first metal layer 110 can be in a metal level (e.g., M1) of the chip 1 immediately adjacent to an interlayer dielectric 103 at the front side 108 of the substrate 101 and the second metal layer 120 can be immediately adjacent to the backside 109 of the semiconductor substrate 101. The height of the substrate 101 and, thereby the distance between the first metal layer 110 and the second metal layer 120 can be approximately 100-200 um. The first metal layer 110 and second metal layer 120 can comprise the same conductive metal (e.g., a copper (Cu), aluminum (Al) or any other suitable metal) or different conductive metals and can each be approximately sub to several microns thick. It should be noted that semiconductor material within the substrate 101 between the two metal layers 110, 120 can be intrinsic (i.e., undoped) and can, thereby provide isolation between the two metal layers 110, 120. For example, in one embodiment, the average resistivity of the substrate 101 can be approximately 1 KOhm-cm.

Figure 3:
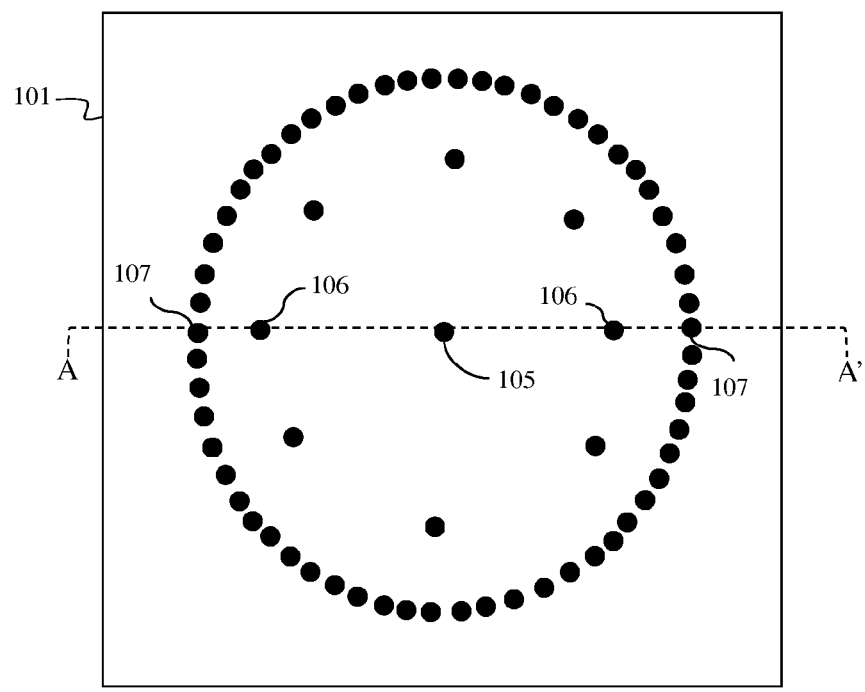
FIG. 3 is a cross-section diagram of an on-chip radial cavity power divider/combiner through a horizontal plane A-A', as shown in FIG. 1.
Figure 4:
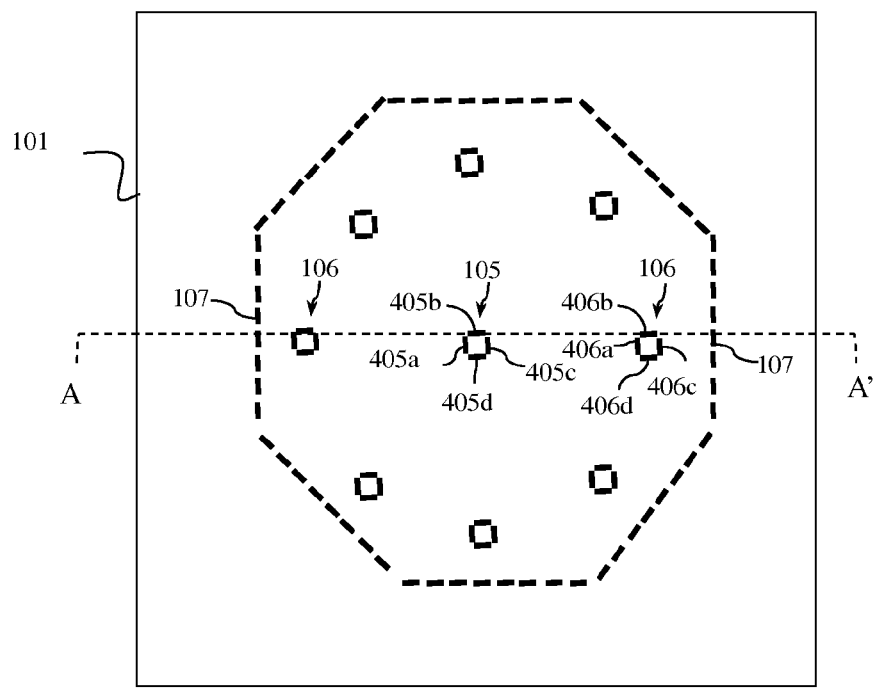
FIG. 4 is a cross-section diagram of another on-chip radial cavity power divider/combiner through the horizontal plane A-A', as shown in FIG. 1.

Additionally, the radial cavity power divider/combiner 100 can comprise a plurality of interconnects that extend vertically from the first metal layer 110 to the second metal layer 120 through the substrate 101. As shown in FIGS. 3 and 4 in combination with FIG. 1, these interconnects can comprise a first interconnect 105, a set of second interconnects 106 and a set of third interconnects 107.

The first interconnect 105 can be positioned at the center of the radial cavity power divider/combiner 100 (i.e., can be an axial interconnect).

The second interconnects 106 can be annularly arranged about the first interconnect 105. The second interconnects 106 can be uniformly spaced (i.e., adjacent interconnects can be separated by a same distance) and can each be approximately ½λ from the first interconnect 105. For example, each second interconnect 106 can be uniformly spaced and can be approximately 0.83mm from the first interconnect 105 for a 60 GHz design.

The third interconnects 107 can similarly be annularly arranged about the set of second interconnects 106, can be uniformly spaced (i.e., adjacent interconnects can be separated by a same distance) and can each be approximately ¾λ from the first interconnect 105. For example, each third interconnect 107 can be uniformly spaced and can be approximately 1.3 mm from the first interconnect 105 for a 60 GHz design. Thus, the set of second interconnects 106 and the set of third interconnects 107 can form concentric symmetric shapes (e.g., rings or multi-sided symmetric polygons) around the first interconnect 105 with the third interconnects 107 creating the required electrical circumferential walls for the radial cavity.

Each interconnect 105, 106, 107 can comprise one or more through silicon vias (TSVs) (also referred to herein as through wafer vias (TWVs)) that are lined and/or filled with a conductor. For example, the TSVs of the interconnects 105, 106, 107 can be lined and/or filled with any of the following metals, metal alloys, or layered combinations thereof: copper, aluminum, tungsten, titanium, tantalum, tungsten nitride, titanium nitride, tantalum nitride, ruthenium, or any other suitable metal or metal alloy. It should further be noted that the sizes and shapes of these TSVs will vary depending upon the TSV processing technique used during integrated chip formation, as well as the design optimization.

For example, as shown in FIG. 3, in one embodiment, the interconnects 105, 106, 107 of the radial cavity power divider/combiner 100 can be essentially identical and each one can comprise a single round TSV, having a diameter of approximately 50 um for a 60 GHz design. One exemplary radial cavity power divider/combiner 100 can comprise 8 round second interconnects 106 for 8-way power dividing or combining and at least 40 (e.g., 60) round third interconnects 107 for creating the required electrical circumferential wall for the radial cavity. Alternatively, any suitable number (e.g., 4, 10, 12, etc.) of round second interconnects 106 can be used to achieve the desired power dividing or combining capacity and any suitable number (e.g., 80, 100, etc.) of round third interconnects can be used to create electrical circumferential wall. As discussed in detail below with regard to the method embodiments, round TSVs can be formed using, for example, a laser drilling technique.

Alternatively, as shown in FIG. 4, in another embodiment, each of the interconnects 105, 106, 107 can comprise one or more rectangular TSVs. For example, in this embodiment, the first interconnect 105 and the second interconnects 106 can each comprise a plurality of rectangular TSVs arranged as walls of a polygon-shaped interconnect, having a width of approximately 50 um. Specifically, as shown in FIG. 4, the first interconnect 105 and second interconnects 106 can each comprise 4 rectangular TSVs (e.g., 405a-d and 406a-d, respectfully) that are arranged as walls of a rectangular interconnect (e.g., a square interconnect). Alternatively, any other suitable number of rectangular TSVs could be used to form a polygon-shaped interconnect 105, 106 (e.g., 6 rectangular TSVs can form a hexagon-shaped interconnect 105, 106, 8 rectangular TSVs can form an octagon-shaped interconnect 105, 106, etc.). For illustration purposes, the first interconnect 105 and second interconnects 106 are shown in FIG. 4 as having the same polygon shape formed from the same number of rectangular TSVs. However, it should be understood that the first interconnect 105 and second interconnects 106 can, alternatively, comprise different numbers of rectangular TSVs arranged to form interconnects having different polygon shapes. One exemplary radial cavity power divider/combiner 100 can comprise 8 square rectangular second interconnects 106 for 8-way power dividing or combining. Alternatively, any suitable number (e.g., 4, 10, 12, etc.) of rectangular second interconnects 106 can be used to achieve the desired power dividing or combining capacity.

Additionally, in this embodiment, the third interconnects 107 can each comprise a single rectangular TSV. Specifically, the rectangular TSVs/third interconnects 107 can be annularly arranged (e.g., in a ring, octagon (as shown in FIG. 4) or other symmetric polygon-shape) around the other interconnects 105, 106 to create the electrical circumferential wall for the radial cavity. Each wall of this symmetric polygon shape can comprise a single relatively long rectangular TSV if the TSV process allows (as shown in FIG. 4) or, alternatively, can comprise multiple shorter rectangular TSVs arranged in a line. As discussed in detail below with regard to the method embodiments, such rectangular TSVs can be formed using, for example, lithographic patterning and etch techniques.

Figure 5:
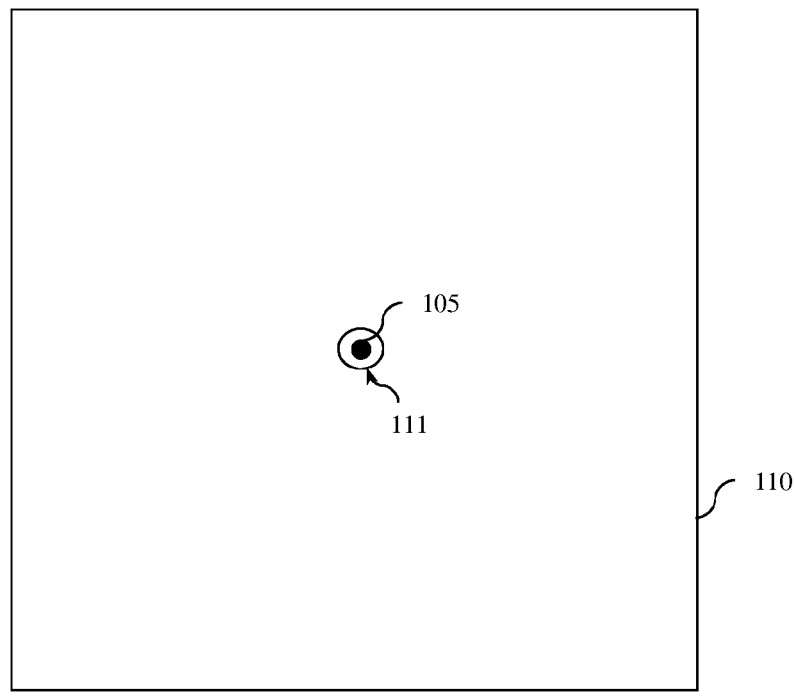
FIG. 5 is a top view diagram of the on-chip radial cavity power divider/combiner of FIG. 1.
Figure 6:
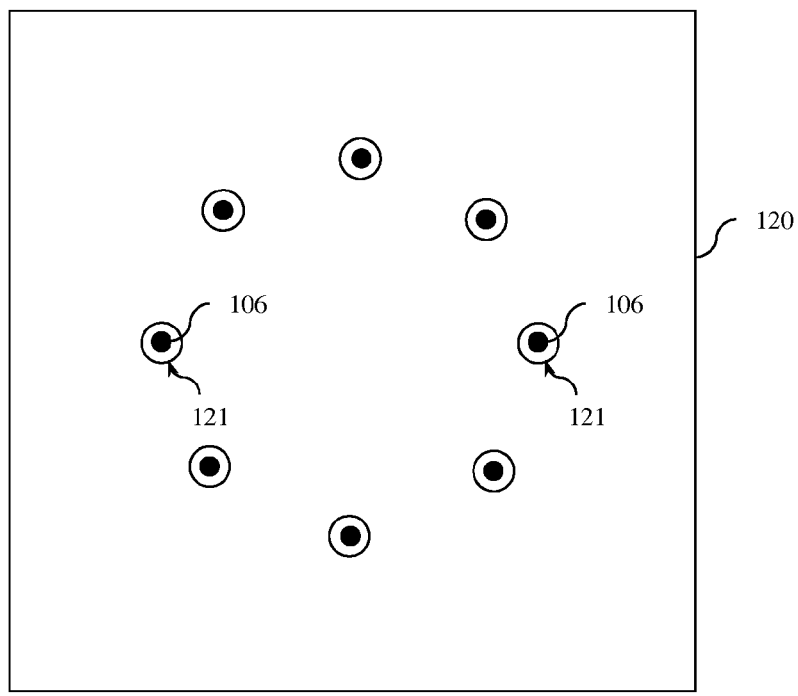
FIG. 6 is a bottom view of the on-chip radial cavity power divider/combiner of FIG. 1.
Figure 7:
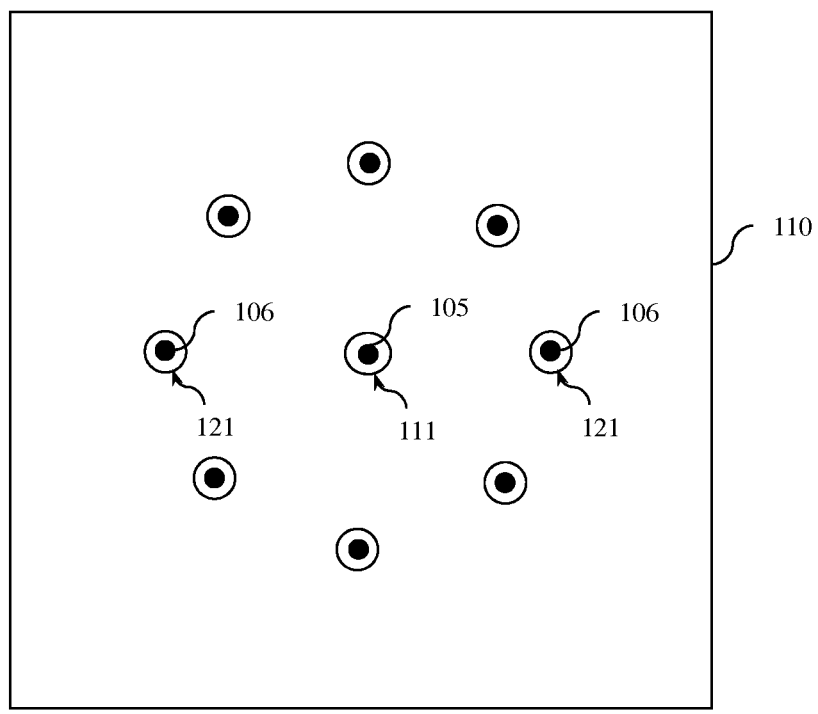
FIG. 7 is a top view diagram of the on-chip radial cavity power divider/combiner of FIG. 2.

Referring again to FIGS. 1 and 2, regardless of the sizes and shapes of the interconnects 105, 106, 107, the third interconnects 107 can be in contact with both the first metal layer 110 and the second metal layer 120 at opposite ends. Contrarily, the first metal layer 110 can have a first opening 111 aligned with and larger than (e.g., several to tens of microns wider than) the first interconnect 105 (see FIG. 5) such that the first interconnect 105 is in contact with the second metal layer 120 but disconnected from the first metal layer 110. Additionally, the second metal layer 120 (as shown in FIG. 1) can have second openings 121 (e.g., also in the shape of rings) aligned with and larger than (e.g., several to tens of microns wider than) the second interconnects 106 (see FIG. 6) such that the second interconnects 106 are in contact with the first metal layer 110, but disconnected from the second metal layer 120. Alternatively, the second openings 121 can be in the first metal layer 110, aligned with and larger than the second interconnects 106 such that the second interconnects 106 are in contact with the second metal layer 120, but disconnected from the first metal layer 110 (as shown in FIGS. 2 and 7).

For a power divider, the first opening 111 can comprise an input port for receiving power from a signal line (e.g., an RF signal line) and the second openings 121 can comprise output ports for applying the power, once divided, to a plurality of other devices on the same chip or on another chip (e.g., see the multi-chip module embodiments described in detail below). For a one-to-eight radial power divider as an example, when a signal line having a 0 dBm (1 mW) signal is connected to the input port 111, each of eight output ports 121 ideally outputs a −9 dBm (0.125 mW) signal. However, it should be understood that, due to various loss mechanisms, the actual outputs may be lower over the operation bandwidth, which can be −9 dBm (0.125 mW) to −10 dBm (0.1 mW) for a good power divider. For a power combiner, the second openings 121 can comprise input ports for receiving power from a plurality of signal lines (e.g., a plurality of RF signal lines) and the first opening 111 can comprise an output port for applying power, once combined, to another device on the same chip 1 or on another chip (e.g., see the multi-chip module embodiments described in detail below). For an eight-to-one radial power combiner as an example, when a signal line having a −9 dBm (0.125 mW) signals are applied to each of eight input powers 121, the output port 111 ideally outputs a 0 dBm (1 mW) signal. However, it should be understood that, due to various loss mechanisms, the actual output can be lower over the operation bandwidth, which can be 0 dBm (1 mW) to −1 dBm (0.8 mW) for a good power combiner.

It should be noted that, at approximately 60 GHz, an 8-way radial cavity power divider/combiner 100, such as that described in detail above and incorporating the round TSVs as shown in FIG. 3, can exhibit a decrease in maximum insertion loss over prior art on-chip power divider/combiners and, particularly, can exhibit a maximum insertion loss of −0.4 dB to −0.9 dB, which equates to less than 10% power loss at center frequency and less than 20% power loss at the −10 dB return loss bandwidth: 54.7-61 GHz. Furthermore, for such a radial cavity power divider/combiner, the magnitude balance within the −10 dB return loss bandwidth is better than +−0.1 dB and the phase balance within the −10 dB return loss bandwidth is better than +/−1 degree. Similarly, at approximately 60 GZ, an 8-way radial cavity power divider/combiner 100, such as that described in detail above and incorporating the rectangular TSVs as shown in FIG. 4, can exhibit a decrease in maximum insertion loss over prior art on-chip power divider/combiners and, particularly, can exhibit a maximum insertion loss of −0.4 dB to −0.9 dB, which equates to less than 10% power loss at center frequency and less than 20% power loss at the −10 dB return loss bandwidth: 52.8-64.8 GHz. Furthermore, for such a radial cavity power divider/combiner, the magnitude balance within the −10 dB return loss bandwidth is better than +−0.2 dB and the phase balance within the −10 dB return loss bandwidth is better than +/−1.2 degrees.

It should be noted that, due to the process steps used to form the interconnects 105, 106 and 107, described in detail below with regard to the method embodiments, the interconnects may extend vertically through one or both of the metal layers 110, 120 (as shown) or may simply abut one or both of the metal layers 110, 120.

In one embodiment, this integrated circuit chip can comprise a three-dimensional integrated circuit (3-D IC) chip wherein the radial cavity power divider/combiner is integrated vertically and/or horizontally with another device or devices 10 on the chip. In another embodiment, the integrated circuit chip 1 can be incorporated into a multiple chip module (MCM) so that the radial cavity power divider/combiner 100 can be integrated vertically and/or horizontally with another device or devices. That is, referring to FIGS. 8 and 9, also disclosed herein are embodiments 800A, 800B of a multiple chip module (MCM). In each of these embodiments 800A, 800B, the MCM can comprise a first integrated circuit chip 1, such as that described in detail above, and a second integrated circuit chip 2 stacked adjacent to (i.e., above or below) the first integrated circuit chip 1. Specifically, the first integrated circuit chip 1 can comprise a substrate 101, a first device 100 on the substrate 101 and additional devices 10 on the substrate 101 positioned laterally adjacent to the first device 100. This first device 100 can comprise a radial cavity power divider, as shown in the embodiment 800A of FIG. 8, or a radial cavity power combiner, as shown in the embodiment 800B of FIG. 9. The second integrated circuit chip 2 can comprise one or more second devices 170 that are electrically connected to and receive power from the first device 100 (i.e., from the radial cavity divider/combiner).

Figure 8:
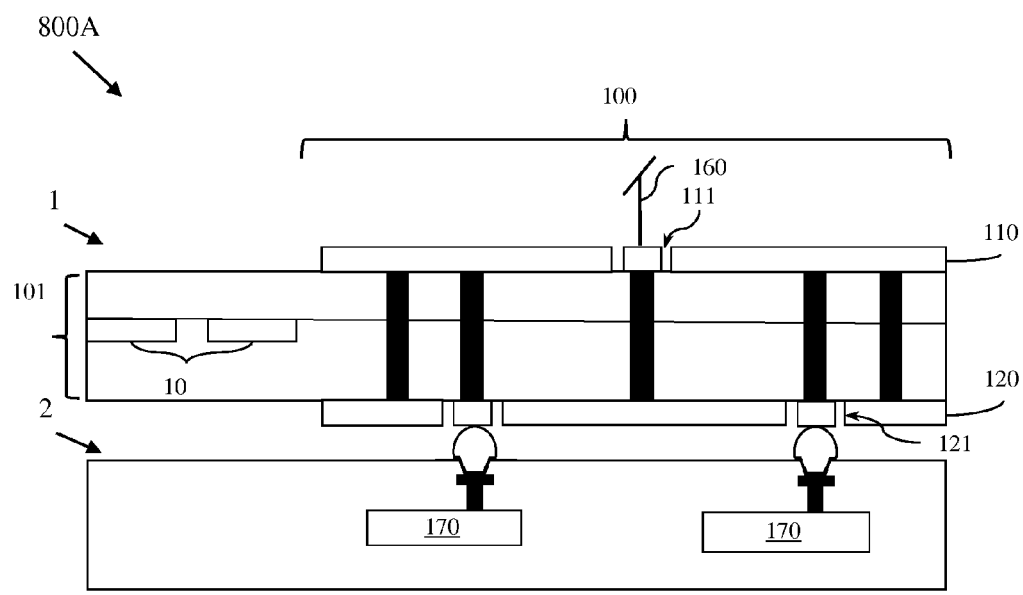
FIG. 8 is an embodiment of a multiple chip module incorporating the integrated circuit chip of FIG. 1.

For example, referring to FIG. 8 in combination with FIG. 1, in one embodiment 800A of the MCM, a signal line 160 (e.g., a radio frequency (RF) signal line) can be electrically connected to the first interconnect 105 at the first opening 111 (i.e., at an input port) in the first metal layer 110 of the first integrated circuit chip 1. Additionally, the second integrated circuit chip 2 can be positioned adjacent to the second metal layer 120 of the chip 1 and can comprise a plurality of second devices 170 electrically connected to the second interconnects 106 at the second openings 121 (i.e., at output ports), for example, in the second metal layer 120 of the first integrated circuit chip 1 (as shown in FIG. 8). It should, however, be understood that, alternatively, the second openings 121 can be in the first metal layer 110, as shown in FIG. 2, and the second integrated circuit chip 2 can be positioned adjacent to the first metal layer 110 in order to allow the connection between the second devices 170 and the output ports (not shown). In this MCM 800A, the first device 100 on the first integrated circuit chip 1 can comprise a radial cavity power divider that receives power from the signal line 160 at the input port 111 and divides the power for application to the second devices 170 on the second integrated circuit chip 2 at the output ports 121. For example, the MCM 800A can comprise a phased array antenna system, wherein the first integrated circuit chip 1 comprises a radial cavity 8-way power divider 100 that receives a 60GHz signal line at the input port 111 and divides the power for application to 8 corresponding phase shifters 170 that are on the second integrated circuit chip 2 and connected in series with corresponding amplifiers. It should be noted that one of the additional devices 10 on the first integrated circuit chip 1 can comprise a switch (e.g., a transistor) that controls the electrical connection between the signal line 160 and the first device 100.

Figure 9:
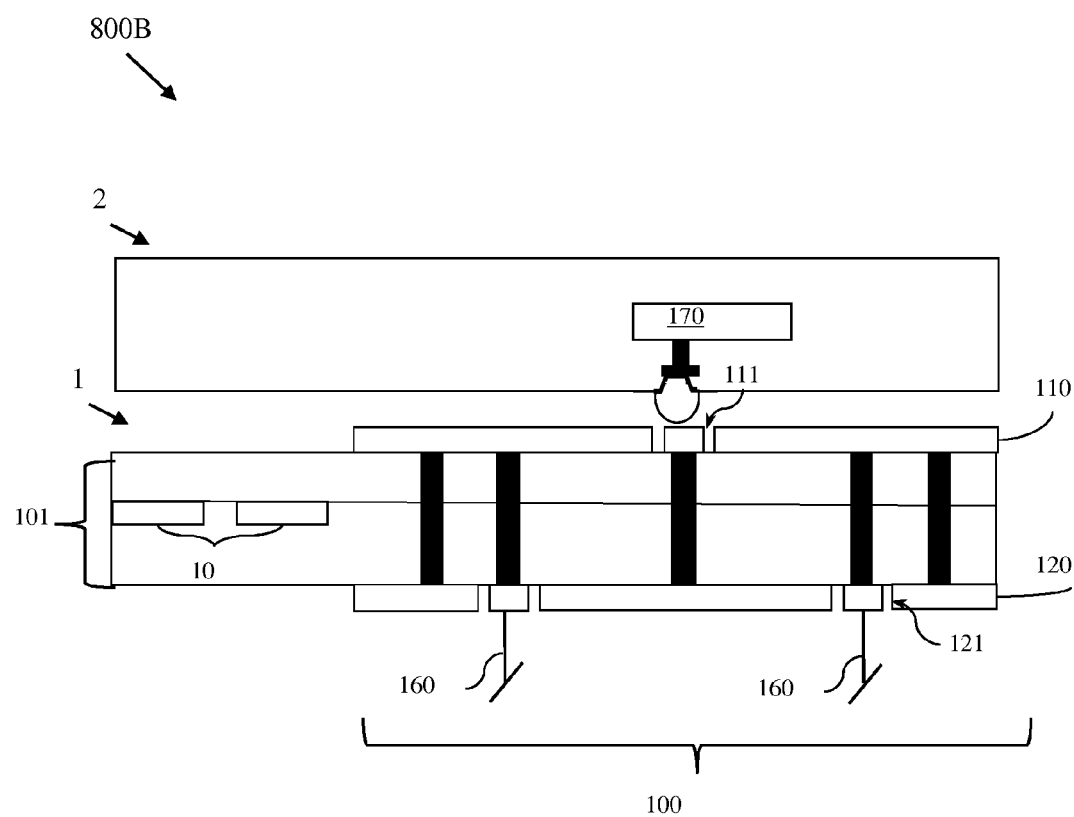
FIG. 9 is another embodiment of a multiple chip module incorporating the integrated circuit of FIG. 1.

Referring to FIG. 9 in combination with FIG. 1, in another embodiment 800B of the MCM, a plurality of signal lines 160 (e.g., radio frequency (RF) signal lines) can be electrically connected to the second interconnects 106 at the second openings 121 (i.e., at input ports) in the second metal layer 120 of the first integrated circuit chip 1 (as shown). It should, however, be understood that, alternatively, the second openings 121 and, thereby, the input ports can be in the first metal layer 110, as shown in FIG. 2. The second integrated circuit chip 2 can comprise a single second device 170 electrically connected to the first interconnect 105 at the first opening 111 (i.e., at an output port) in the first metal layer 110 of the first integrated circuit chip 1. In this MCM 800B, the first device 100 can comprise a radial cavity power combiner that receives power from the signal lines 160 at the input ports 121 and combines the power for application to the second device 170 at the output port 111. It should be noted that at least some of the additional devices 10 on the first integrated circuit chip 1 can comprise switches that control the connection between the signal lines 160 and the first device 100.

Figure 10:
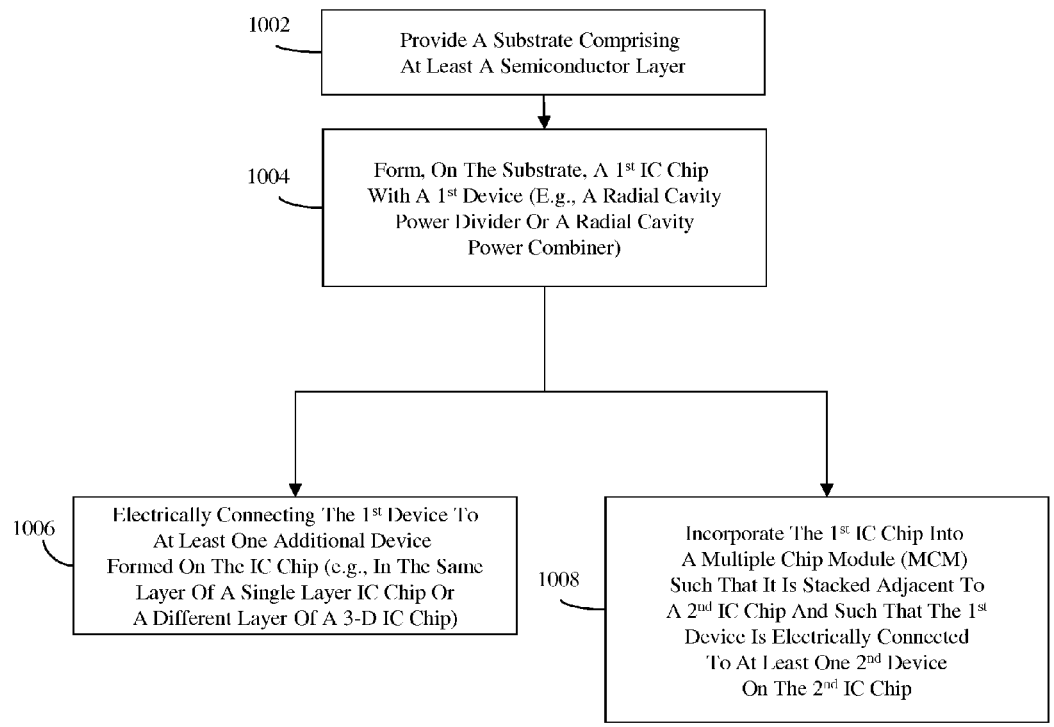
FIG. 10 is a flow diagram illustrating an embodiment of a method of forming an integrated circuit chip or a multiple chip module.

Referring to FIG. 10, also disclosed herein are method embodiments for forming the above-described integrated circuit chip 1, as shown in FIGS. 1 and 2 (e.g., a single layer integrated circuit chip or a three-dimensional integrated circuit (3-D IC) chip) with a radial cavity power divider/combiner and for forming a multiple chip module (MCM) incorporating such a chip. Methods of forming and operating radial cavity power divider/combiner structures are generally known in the art. However, such methods typically use bulk conductive cavity or standard printed circuit board processing techniques and not the integrated circuit processing techniques (i.e., do not incorporate a radial cavity power divider/combiner into an integrated circuit chip), as disclosed herein.

The method embodiments can comprise providing a substrate, having a first side and a second side opposite the first side (1002). This substrate can comprise at least a semiconductor layer. For example, the substrate can comprise a bulk semiconductor layer (e.g., a bulk silicon layer or any other bulk semiconductor layer). Alternatively, the substrate can comprise a semiconductor-on-insulator (SOI) structure. Those skilled in the art will recognize that a semiconductor-on-insulator (SOI) structure can comprise an insulator layer (e.g., a buried oxide or other suitable insulator layer) between two semiconductor layers (e.g., between two silicon layers or between any other suitable semiconductor layers). Additionally, the substrate can comprise one or more dielectric layers (e.g., interlayer dielectrics, such as silicon dioxide (SiO2), silicon nitride (SiN), borophosphosilicate glass (BPSG), etc.) at one or both sides. The height of the substrate 101 can, for example, be approximately 100 um to 200 um after processing.

The method embodiments can further comprise forming, on the substrate 101, a first integrated circuit chip 1 with a first device 100 and, particularly, with a radial cavity power divider/combiner, positioned laterally adjacent to additional devices 10 (1004, see FIGS. 1 and 2 and the detailed discussion with regard to the structure embodiments above). It should be noted that semiconductor material within the substrate 101 in the area designated for formation of the device 100 can be intrinsic (i.e., undoped) such that it has, for example, an average resistivity of approximately 1 KOhm-cm.

The additional devices 10 can include, but are not limited to, diodes, field effect transistors, bipolar junction transistors, resistors, capacitors, inductors, etc. within and/or above the semiconductor layer 102. Techniques for forming such on-chip devices are well known in the art and, thus, are omitted from this specification in order to allow the reader to focus on the salient aspects of the invention.

Process 1004 can be performed so that the resulting first device (i.e., the radial cavity power divider/combiner 100) has interconnects 105, 106, 107, which are essentially identical single round TSVs with a diameter of 50 um for a 60 GHz design and which are positioned, for example, as shown in FIG. 3 and described in detail above with regard to the structure embodiments.

Figure 11:
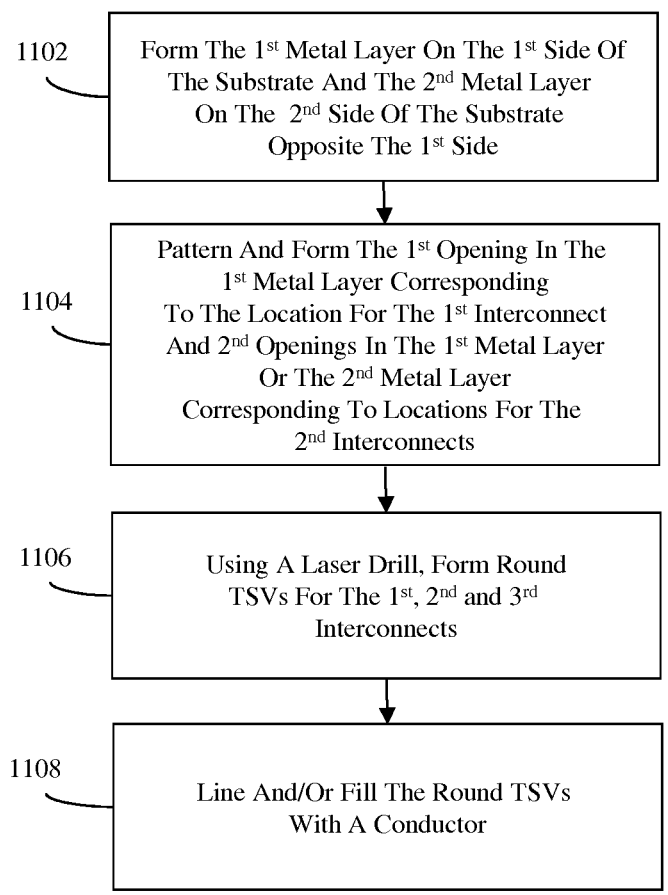
FIG. 11 is a flow diagram illustrating a method for performing process step 1004 of the method of FIG. 10.
Figure 12A:
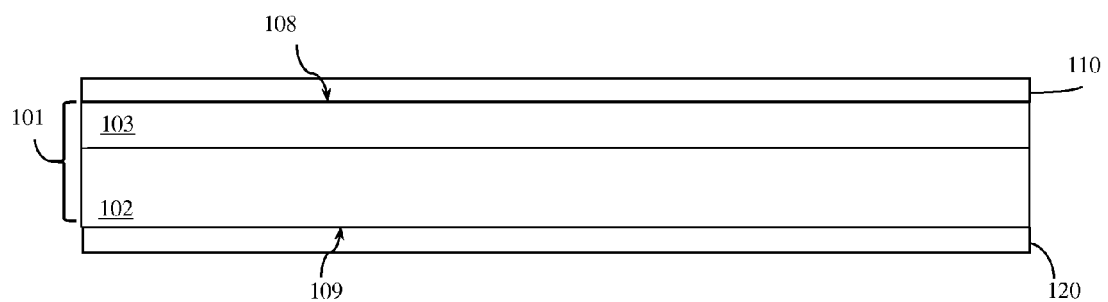
FIG. 12A is a partially completed integrated circuit chip formed according to the method of FIG. 11.
Figure 12B:
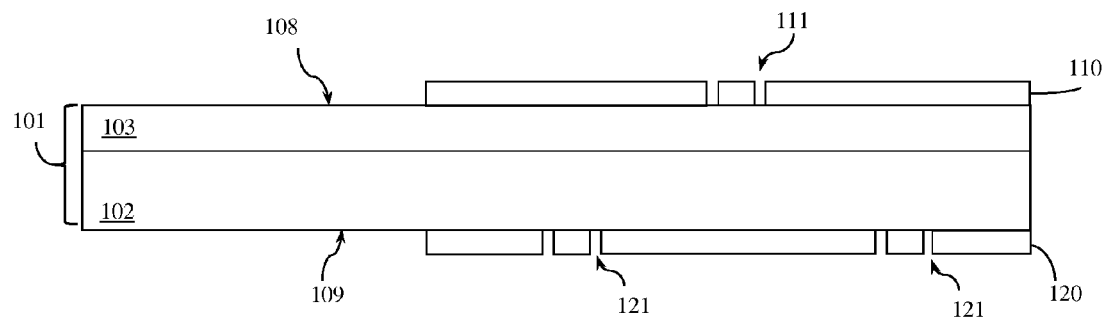
FIG. 12B is a partially completed integrated circuit chip formed according to the method of FIG. 11.
Figure 12C:
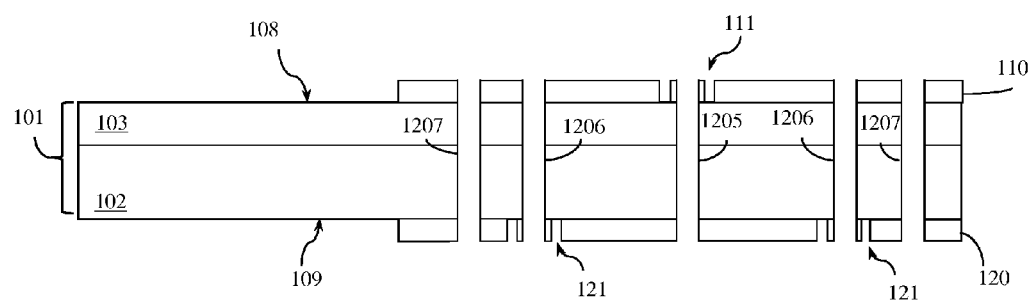
FIG. 12C is a partially completed integrated circuit chip formed according to the method of FIG. 11.
Figure 12D:
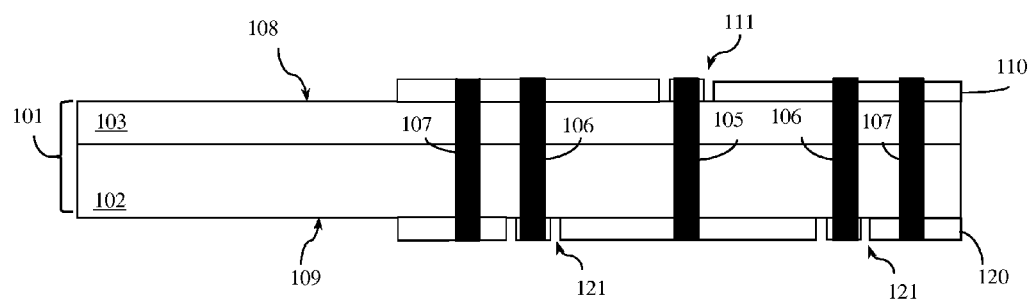
FIG. 12D is a partially completed integrated circuit chip formed according to the method of FIG. 11.

For example, referring to FIG. 11, the method can comprise forming the first metal layer 110 on the first side 108 of the substrate 101 (e.g., on the front side of the substrate 101 adjacent to an interlayer dielectric 103) and further forming the second metal layer 120 on the second side 109 of the substrate 101 (e.g., on the back side of the substrate 101) (1102, see FIG. 12A). The first metal layer 110 and second metal layer 120 can be formed, for example, using conventional electrodeposition techniques such that they comprise the same conductive metal (e.g., a copper (Cu), aluminum (Al) or any other suitable metal) or different conductive metals and such that they are each approximately sub to several microns thick. Next, the first openings 111 can be formed in the first metal layer 110 and second openings 121 can be formed in either the first metal layer or the second metal layer, using conventional lithographic patterning and etch techniques (1104, see FIG. 12B). Specifically, the first opening 111 can be formed in the first metal layer 110 such that it is aligned above the desired location for the first interconnect 105 and second openings 121 can be formed either in the second metal layer 120 (as shown) or the first metal layer 110 such that they are aligned with the desired locations for the second interconnects 106. Additionally, round through silicon vias (TSVs) 1205, 1206, 1207 for first, second, and third interconnects, respectively, can be formed, for example, using a conventional laser drilling technique (1106, see FIG. 12C). Specifically, the round TSVs 1205, 1206, 1207 can be formed such that they extend vertically through the first metal layer 110, substrate 101 and second metal layer 120. Once formed, the round TSVs 1205, 1206, 1207 can be lined and/or filled with a conductor to form the first, second and third interconnects 105, 106 and 107 (1108, see FIG. 12D). For example, any one of the following metals, metal alloys, or layered combinations thereof can be deposited (e.g., using electrodepositing, chemical vapor deposition (CVD), etc., as appropriate) to line and/or fill the TSVs 1205, 1206, 1207: copper, aluminum, tungsten, titanium, tantalum, tungsten nitride, titanium nitride, tantalum nitride, ruthenium, or any other suitable metal or metal alloy.

Figure 13:
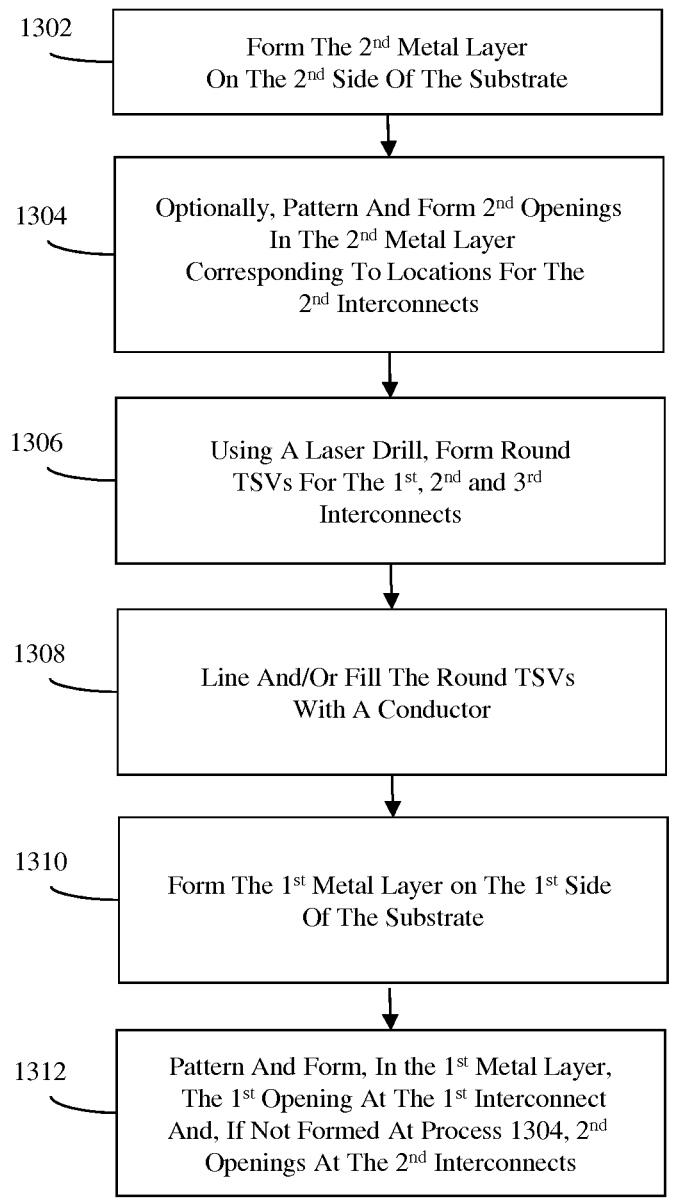
FIG. 13 is a flow diagram illustrating a method for performing process step 1004 of the method of FIG. 10.
Figure 14A:
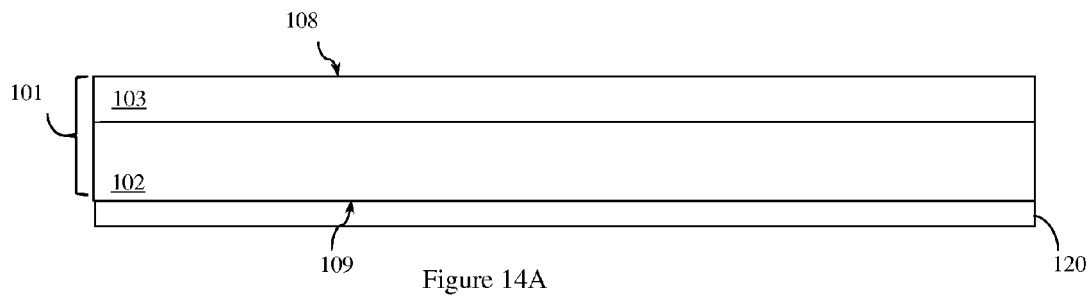
FIG. 14A is a partially completed integrated circuit chip formed according to the method of FIG. 13.
Figure 14B:
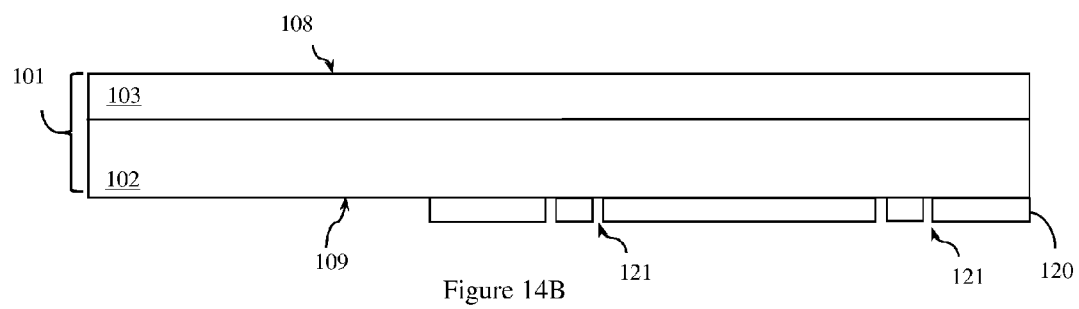
FIG. 14B is a partially completed integrated circuit chip formed according to the method of FIG. 13.
Figure 14C:
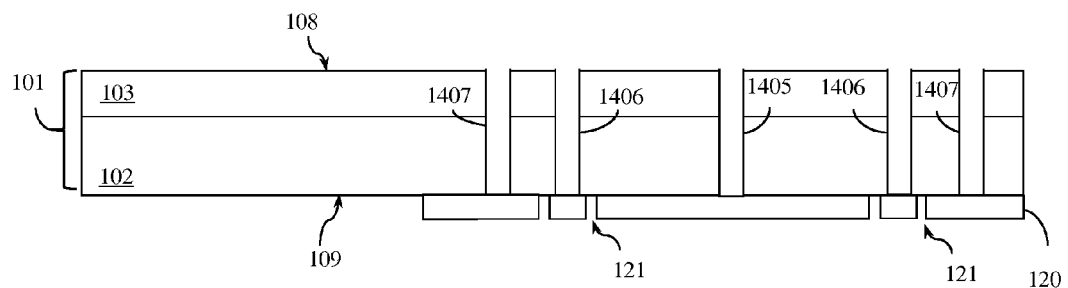
FIG. 14C is a partially completed integrated circuit chip formed according to the method of FIG. 13.
Figure 14D:
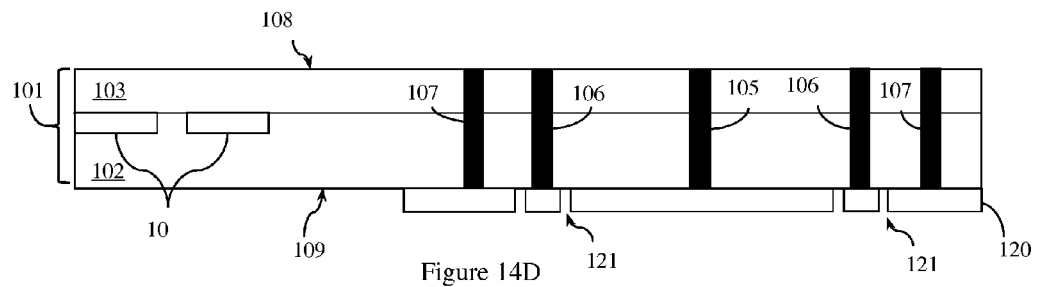
FIG. 14D is a partially completed integrated circuit chip formed according to the method of FIG. 13.
Figure 14E:
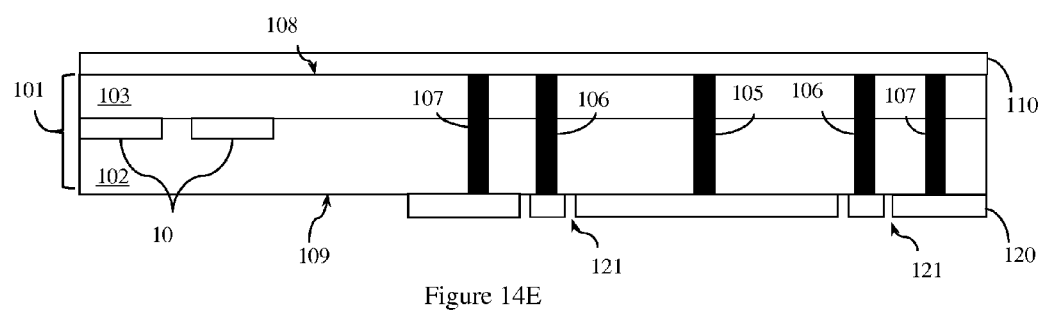
FIG. 14E is a partially completed integrated circuit chip formed according to the method of FIG. 13.
Figure 14F:
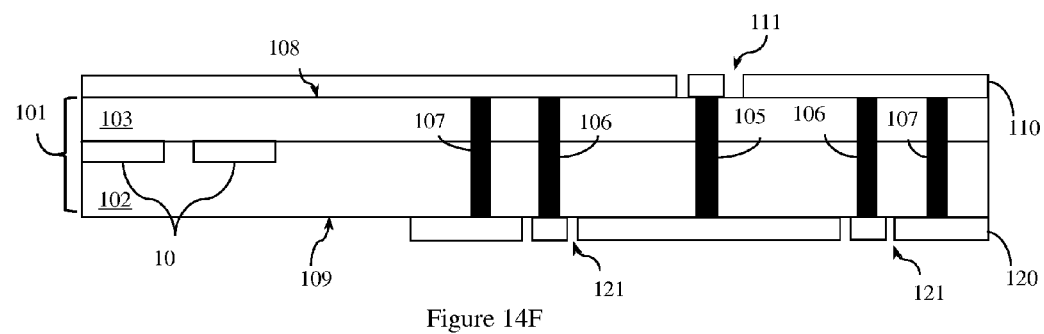
FIG. 14F is a partially completed integrated circuit chip formed according to the method of FIG. 13.

Alternatively, referring to FIG. 13, the method can comprise forming the second metal layer 120 on the second side 109 (e.g., on the back side) of the substrate 101 (1302, see FIG. 14A). The second metal layer 120 can be formed, for example, using conventional electrodeposition techniques such that it comprises a conductive metal (e.g., a copper (Cu), aluminum (Al) or any other suitable metal) and such that it is approximately sub to several microns thick. Optionally, second openings 121 can be formed in the second metal layer 120, using conventional lithographic patterning and etch techniques (1304, see FIG. 14B). Specifically, the second openings 121 can be formed in the second metal layer 120 such that they are aligned below the desired locations for the second interconnects. Then, round through silicon vias (TSVs) 1405, 1406, 1407 for first, second and third interconnects, respectively, can be formed, for example, using a conventional laser drilling technique (1306, see FIG. 14C). Such round TSVs 1405, 1406, 1407 can be formed such that they extend vertically through the substrate 101 to the second metal layer 120. Once formed, the round TSVs 1405, 1406, 1407 can be lined and/or filled with a conductor to form the first, second and third interconnects 105, 106, 107, respectively (1308, see FIG. 14D). For example, any one of the following metals, metal alloys, or layered combinations thereof can be deposited (e.g., using electrodepositing, chemical vapor deposition (CVD), etc., as appropriate) to line and/or fill the TSVs 1405, 1406, 1407: copper, aluminum, tungsten, titanium, tantalum, tungsten nitride, titanium nitride, tantalum nitride, ruthenium, or any other suitable metal or metal alloy. After the TSVs are lined and/or filled with a conductor, the first metal layer 110 can be formed on the first side 108 of the substrate 101 (e.g., on the front side of the substrate 101 adjacent to an interlayer dielectric 103) (1310, see FIG. 14E). The first metal layer 110 can be formed, for example, using conventional electrodeposition techniques such that it comprises the same conductive metal as the second metal layer 120 or a different conductive metal and further such that it is approximately sub to several microns thick. Finally, the first opening 111 can be formed in the first metal layer 110 and, if second openings 121 were not formed in the second metal layer 120 at process 1304, second openings 121 can also be formed in the first metal layer 110 (not shown), using conventional lithographic patterning and etch techniques (1312, see FIG. 14F). Specifically, the first opening 111 can be formed in the first metal layer 110 such that it is aligned above the first interconnect 105 and, if not previously formed, second openings 121 can be formed in the second metal layer 120 such that they are aligned above the second interconnects 106.

Referring again to FIG. 10, process 1004 can alternatively be performed so that the resulting first device (i.e., the radial cavity power divider/combiner 100) has interconnects 105, 106, 107, which each comprise one or more rectangular through silicon vias (TSVs) and which are positioned, for example, as shown in FIG. 4.

Figure 15:
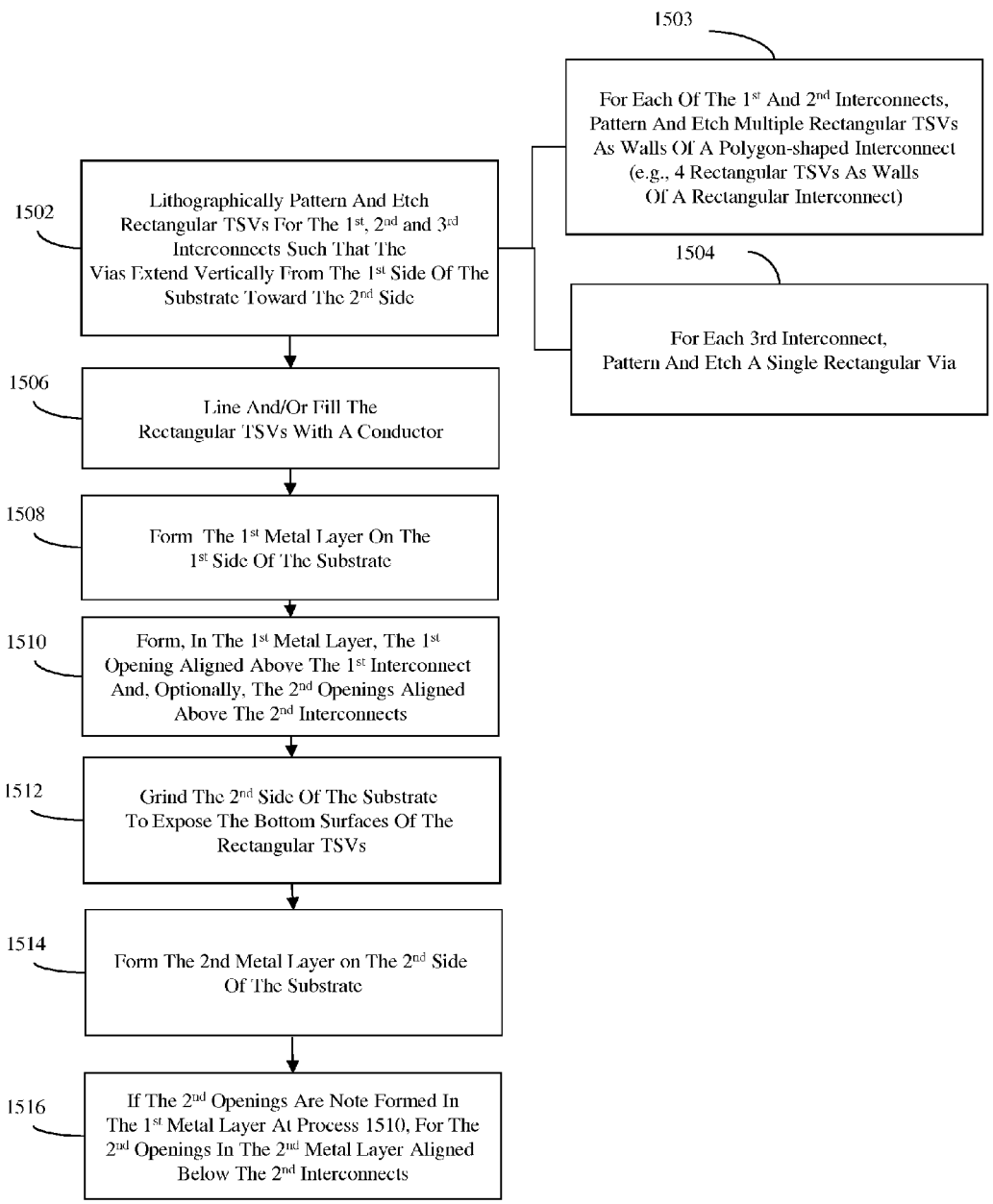
FIG. 15 is a flow diagram illustrating a method for performing process step 1004 of the method of FIG. 10.
Figure 16A:
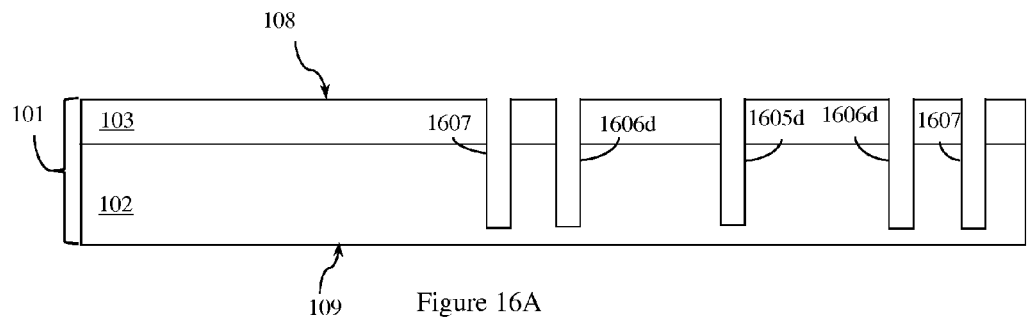
FIG. 16A is a partially completed integrated circuit chip formed according to the method of FIG. 15.
Figure 16B:
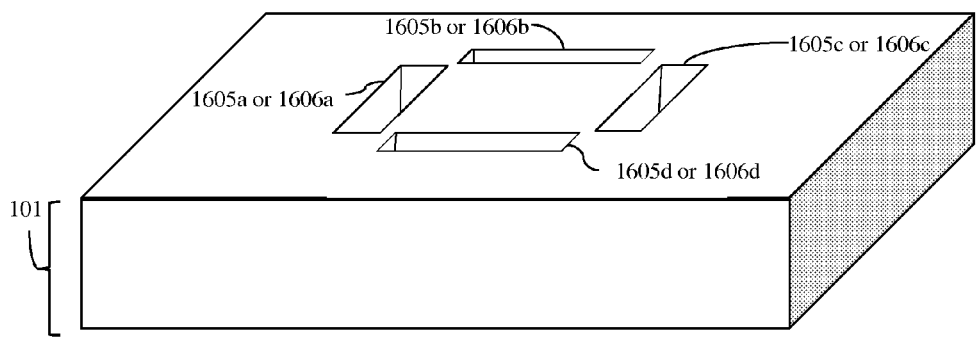
FIG. 16B is a perspective view diagram of one of the interconnects of FIG. 16A.

Specifically, referring to the flow diagram of FIG. 15, the method can alternatively comprise forming, for first, second and third interconnects, respectively, a plurality of rectangular through silicon vias (TSVs) 1605a-d, 1606a-d and 1607 extending vertically into the substrate 101 from the first side 108 (e.g., the front side comprising an interlayer dielectric 103) toward the second side (e.g., the back side) (1502, see FIGS. 16A and 16B). To accomplish this, conventional lithographic patterning and etch techniques can be used to form, for the first interconnect and for each of the second interconnects, multiple rectangular TSVs that create the walls of a polygon-shaped interconnect (1503). For example, FIG. 16B is an exploded perspective view of four rectangular TSVs 1605a-d (or 1606a-d) that are patterned and etched as shown in order to form the four walls 405a-b, 406a-b of the exemplary rectangular shaped interconnect 105 or 106, as shown in FIG. 4. Additionally, it should be noted that at process 1502, for each of the third interconnects, a single rectangular TSV 1607 can also be patterned and etched (1504).

Figure 16C:
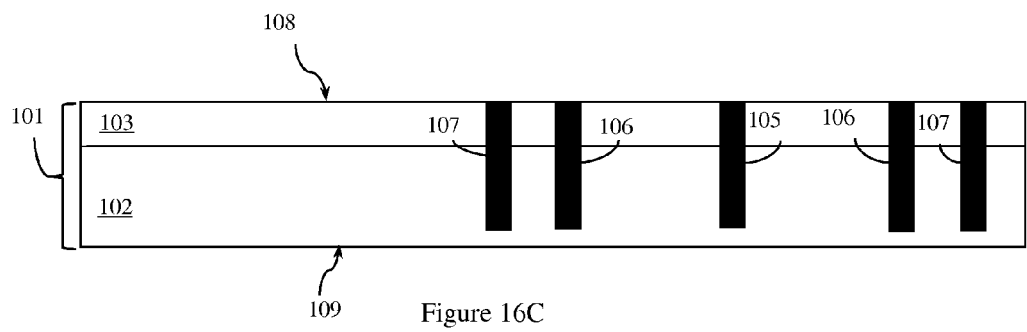
FIG. 16C is a partially completed integrated circuit chip formed according to the method of FIG. 15.

Once formed, the rectangular TSVs 1605a-d, 1606a-d and 1607 can be lined and/or filled with a conductor so as to form the first, second and third interconnects 105, 106 and 107, respectively (1506, see FIG. 16C). For example, any one of the following metals, metal alloys, or layered combinations thereof can be deposited (e.g., using electrodepositing, chemical vapor deposition (CVD), etc., as appropriate) to line and/or fill the TSVs 1605a-d, 1606a-d, 1607: copper, aluminum, tungsten, titanium, tantalum, tungsten nitride, titanium nitride, tantalum nitride, ruthenium, or any other suitable metal or metal alloy.

Figure 16D:
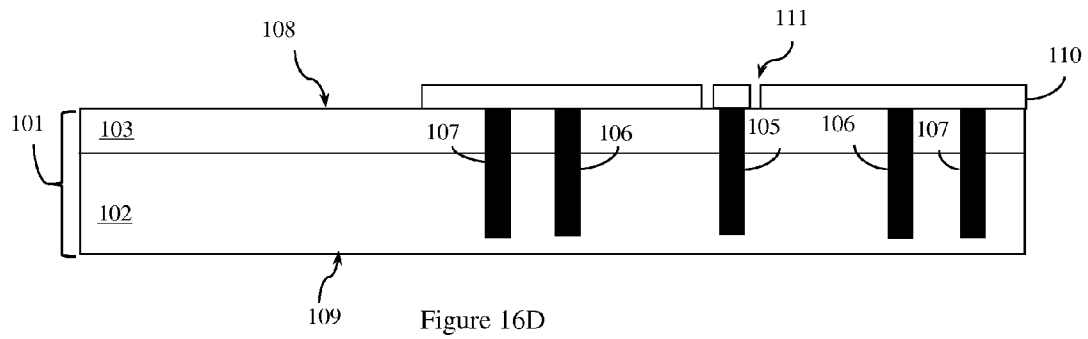
FIG. 16D is a partially completed integrated circuit chip formed according to the method of FIG. 15.

Next, the first metal layer 110 can be formed on the first side 108 of the substrate 101 (1508, see FIG. 16D). Specifically, the first metal layer 110 can be formed, for example, using conventional electrodeposition techniques such that it comprises a conductive metal (e.g., copper (Cu), aluminum (Al) or any other suitable metal) and such it is each approximately sub to several microns thick.

Next, the first opening 111 and, optionally, second openings 121 can be formed in the first metal layer 110, using conventional lithographic patterning and etch techniques (1510, see FIG. 16D). Specifically, the first opening 111 can be formed in the first metal layer 110 such that it is aligned above the first interconnect 105 and, optionally, second openings 121 can be formed in the first metal layer 110 such that they are aligned above the second interconnects 106 (not shown).

Figure 16E:
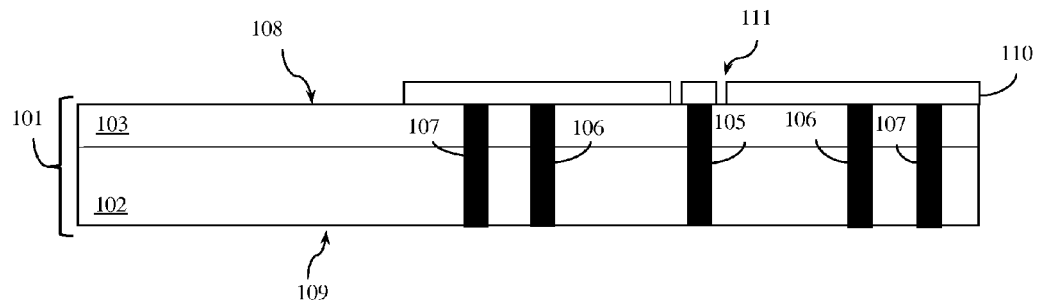
FIG. 16E is a partially completed integrated circuit chip formed according to the method of FIG. 15.
Figure 16F:
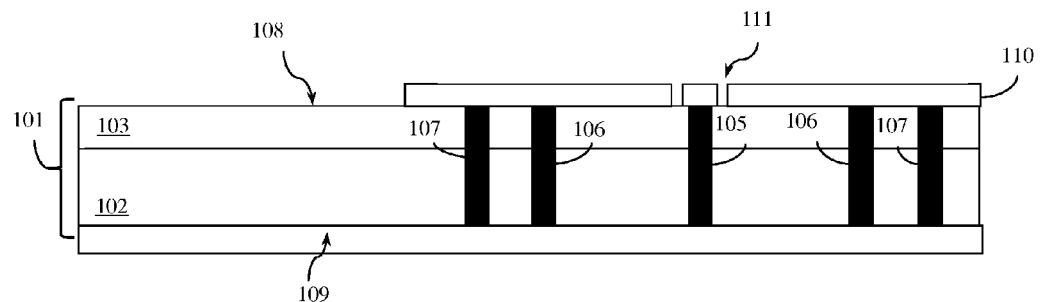
FIG. 16F is a partially completed integrated circuit chip formed according to the method of FIG. 15.

Subsequently, the second side (e.g., the back side) of the substrate 101 can be ground down or polished to expose the bottom surfaces of the rectangular TSVs (i.e., to expose the bottom surfaces of the interconnects 105, 106, 107) (1512, see FIG. 16E). Then, the second metal layer 120 can be formed on the second side 109 of the substrate 101 (e.g., on the back side of the substrate 101 adjacent to bottom surfaces of the interconnects 105, 106, 107) (1514, see FIG. 16F). The second metal layer 120 can be formed, for example, using conventional electrodeposition techniques such that it comprises the same conductive metal as the first metal layer 110 or a different conductive metal and further such that it is approximately sub to several microns thick.

Figure 16G:
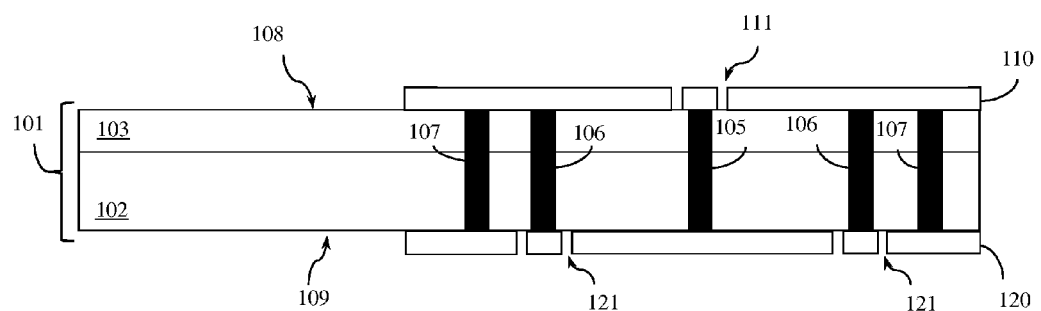
FIG. 16G is a partially completed integrated circuit chip formed according to the method of FIG. 15.

Finally, if second openings 121 were not formed in the first metal layer 110 at process 1510, the second openings 121 can be formed in the second metal layer 120, using conventional lithographic patterning and etch techniques (1516, see FIG. 16G). Specifically, the second openings 121 can be formed in the second metal layer 120 such that they are aligned below the second interconnects 106.

It should be understood regardless of the TSV formation techniques used, the process 1004 of FIG. 10 should be performed so that the resulting interconnects 105, 106, 107 are arranged, as described in detail above with regard to the structure embodiments. In other words, the first interconnect 105 should be at the center of the device 100. The number of second interconnects 106 should be equal to the desired dividing and/or combining capacity. Additionally, the second interconnects 106 should be annularly arranged around the first interconnect 105, should be uniformly spaced (i.e., adjacent interconnects should be separated by a same distance) and should be approximately ½λ from the first interconnect 105. Furthermore, the third interconnects 107 should similarly be annularly arranged about the set of second interconnects 106, should be uniformly spaced (i.e., adjacent interconnects can be separated by a same distance) and should each be approximately ¾λ from the first interconnect 105 in order to form the required electrical circumferential walls for the radial cavity.

For example, for an 8-way radial cavity power divider/combiner 100 at 60 GHz, 8 second interconnects 106 can each be approximately 0.83 mm from and annularly arranged around the first interconnect 105 and a greater number of third interconnects 107 can each be approximately 1.3 mm from and annularly arranged around the first interconnect 105 such that the first and second interconnects form concentric rings around the first interconnect 105.

Referring again to FIG. 10, the method embodiments can further comprise electrically connecting one or more of the additional devices 10 on the first integrated circuit chip 1 (e.g., additional device(s) 10 in the same layer of a single layer integrated circuit chip or additional device(s) in the same layer, an upper layer or a lower layer of a three-dimensional integrated circuit chip (3-D IC) chip) to the first device 100 in order to receive divided or combined power therefrom (1006). That is, during conventional back end of the line (BEOL) processing, additional wires and interconnects can be formed on the chip 1 in order to electrically connect a radial cavity power divider between a signal line and other devices (or to electrically connect a radial cavity power combiner between multiple power supplies and another device on the chip).

Alternatively, the method embodiments can comprise incorporating the first integrated circuit chip 1 into a multiple chip module (MCM) such that it is stacked adjacent to (i.e., above or below) a second integrated circuit chip 2 and further such that one or more second devices 170 on the second integrated circuit chip 2 are electrically connected to and receive power from the first device 100 (i.e., from the radial cavity divider/combiner) (1008, see FIGS. 8 and 9).

For example, in one embodiment, as shown in FIG. 8, the method can comprise electrically connecting a signal line 160 (e.g., a radio frequency (RF) signal line) to the first interconnect 105 at the first opening 111 (i.e., at an input port) in the first metal layer 110 of the first device 100. Additionally, in this embodiment, the method can comprise electrically connecting a plurality of second devices 170 on the second integrated circuit chip 2 to the second interconnects 106 at the second openings 121 (i.e., at output ports), which can be in the second metal layer 120 of the first device 100 (as shown) or which can be in the first metal layer 110. Thus, in this case, the first device 100 can receive power from the signal line 160 at the input port 111 and can divide the power for application to the second devices 170 at the output ports 121.

In another embodiment, as shown in FIG. 9, the method can comprise electrically connecting a plurality of signal lines 160 (e.g., a plurality of radio frequency (RF) signal lines) to the second interconnects 106 at the second openings 121 (i.e., at the input ports), which can be in the second metal layer 120 of the first device 100, as shown, or which can be in the first metal layer 110. Additionally, the method can comprise electrically connecting a single second device 170 on the second integrated circuit chip 2 to the first interconnect 105 at the first opening (i.e., at an output port) in the first metal layer 110 of the first device 100. Thus, in this case, the first device 100 can receive power from the signal lines 160 at the input ports 121 and can combine the power for application to the second device 170 at the output port 111.

It should be understood that the terminology used herein is for the purpose of describing particular embodiments only and is not intended to be limiting of the embodiments. As used herein, the singular forms "a", "an" and "the" are intended to include the plural forms as well, unless the context clearly indicates otherwise. It should further be understood that the terms "comprises", "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof. In addition, it should be understood that terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", "immediately adjacent to", etc., mean that at least one element physically contacts another element (without other elements separating the described elements).

It should further be understood that the method embodiments, as described above, shall be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Finally, it should be understood that the corresponding structures, materials, acts, and equivalents of all means or step plus function elements in the claims below are intended to include any structure, material, or act for performing the function in combination with other claimed elements as specifically claimed. The description of the embodiments contained in the specification have been presented for purposes of illustration and description, but is not intended to be exhaustive or limited to the embodiments in the forms disclosed. Many modifications and variations to the disclosed embodiments will be apparent to those of ordinary skill in the art without departing from the scope and spirit of the embodiments.

Therefore, disclosed above are embodiments of an integrated circuit chip with a radial cavity power divider/combiner that can be used for millimeter wave applications. The power divider/combiner can comprise first and second metal layers on opposite sides of a substrate. Interconnects can extend vertically through the substrate and can comprise: a first interconnect, a set of second interconnects annularly arranged about the first interconnect and a set of third interconnects annularly arranged about the set of second interconnects. Each interconnect can comprise one or more through silicon vias (TSVs) lined and/or filled with a conductor. For a power divider, a first opening in the first metal layer at the first interconnect can comprise an input port for receiving power from a signal line (e.g., a radio frequency (RF) signal line) and second openings in either the first metal layer or the second metal layer at the second interconnects can comprise output ports for applying power, once divided, to a plurality of other devices. For a power combiner, second openings in either the first metal layer or the second metal layer at the second interconnects can comprise input ports for receiving power from a plurality of signal lines and a first opening in the first metal layer at the first interconnect can comprise an output port for applying power, once combined, to another device. In one embodiment, this integrated circuit chip can comprise a three-dimensional integrated circuit (3-D IC) chip wherein the radial cavity power divider/combiner is integrated vertically and/or horizontally with another device or devices. In another embodiment, the integrated circuit chip can be incorporated into a multiple chip module (MCM) so that the radial cavity power divider/combiner can be integrated vertically and/or horizontally with another device or devices. Also disclosed herein are associated method embodiments for forming the above-described integrated circuit chip, including a 3-D integrated circuit chip, and for forming a MCM incorporating such an integrated circuit chip.

What is claimed is:

1. An integrated circuit chip comprising:
   a substrate, having a first side and a second side opposite said first side, said substrate comprising at least a semiconductor layer; and
   a device for at least one of on-chip power dividing and on-chip power combining on said integrated circuit chip, said device comprising:
      a first metal layer on said first side;
      a second metal layer on said second side; and
      a plurality of interconnects extending vertically through said substrate from said first metal layer to said second metal layer, said interconnects comprising:
         a first interconnect;
         a set of second interconnects annularly arranged about said first interconnect; and
         a set of third interconnects annularly arranged about said set of second interconnects,
      said first metal layer having a first opening aligned with and larger than said first interconnect such that said first interconnect is disconnected from said first metal layer and one of said first metal layer and said second metal layer having a plurality of second openings, each second opening being aligned with and larger than a second interconnect such that said second interconnect is disconnected from said one of said first metal layer and said second metal layer.

2. The integrated circuit chip of claim 1, said second interconnects being uniformly spaced and approximately ½ a specified length from said first interconnect and said third interconnects being uniformly spaced and approximately ¾ said specified length from said first interconnect, said specified length being a wavelength (λ).

3. The integrated circuit chip of claim 1, said interconnects comprising round vias extending vertically through said substrate and being at least lined with a conductor.

4. The integrated circuit chip of claim 1, said first interconnect and said second interconnects each comprising a plurality of rectangular vias extending vertically through said substrate and arranged as walls of polygon-shaped interconnect, said rectangular vias being at least one of lined and filled with a conductor, and said third interconnects each comprising a single rectangular via extending vertically through said substrate and being at least one of lined and filled with said conductor.

5. The integrated circuit chip of claim 4, said plurality of rectangular vias comprising 4 rectangular vias arranged as walls of a rectangular interconnect.

6. The integrated circuit chip of claim 1, further comprising additional devices positioned laterally adjacent to said device, said additional devices comprising at least one switch controlling a connection between a signal line and said device.

7. The integrated circuit chip of claim 1, said set of second interconnects comprising at least 4 second interconnects and said set of third interconnects comprising at least 40 third interconnects.

8. The integrated circuit chip of claim 1, said device comprising an 8-way power divider.

9. The integrated circuit chip of claim 1, said integrated circuit chip comprising a three-dimensional integrated circuit chip.

10. A multiple chip module comprising:
a first integrated circuit chip comprising:
a substrate, having a first side and a second side opposite said first side, said substrate comprising at least a semiconductor layer; and
first device for at least one of on-chip power dividing and on-chip power combining on said first integrated circuit chip, said first device comprising:
a first metal layer on said first side;
a second metal layer on said second side; and
a plurality of interconnects extending vertically through said substrate from said first metal layer to said second metal layer, said interconnects comprising:
a first interconnect, said first metal layer having a first opening aligned with and larger than said first interconnect such that said first interconnect is disconnected from said first metal layer;
a set of second interconnects annularly arranged about said first interconnect, said second metal layer having a plurality of second openings, each second opening being aligned with and larger than a second interconnect such that said second interconnect is disconnected from said second metal layer; and
a set of third interconnects annularly arranged about said set of second interconnects; and
a second integrated circuit chip stacked adjacent to said first integrated circuit chip, said second integrated circuit chip comprising at least one second device electrically connected to said first device.

11. The multiple chip module of claim 10, further comprising a signal line electrically connected to said first interconnect at said first opening,
said second integrated circuit chip comprising a plurality of second devices electrically connected to said second interconnects at said second openings, and
said first device receiving power from said signal line at said first opening and dividing said power for application to said second devices at said second openings.

12. The multiple chip module of claim 10, further comprising a plurality of signal lines electrically connected to said second interconnects at said second openings,
said second integrated circuit chip comprising a single second device electrically connected to said first interconnect at said first opening, and
said first device receiving power from said signal lines at said second openings and combining said power for application to said second device at said first opening.

13. The multiple chip module of claim 10, said first integrated circuit chip further comprising additional devices positioned laterally adjacent to said first device.

14. A method comprising:
providing a substrate, having a first side and a second side opposite said first side, said substrate comprising at least a semiconductor layer; and
forming a first integrated circuit chip on said substrate, said forming of said first integrated circuit chip comprising forming a first device for at least one of on-chip power dividing and on-chip power combining on said first integrated circuit chip, said first device comprising:
a first metal layer on said first side;
a second metal layer on said second side; and
a plurality of interconnects extending vertically through said substrate from said first metal layer to said second metal layer, said interconnects comprising:
a first interconnect;
a set of second interconnects annularly arranged about said first interconnect; and
a set of third interconnects annularly arranged about said set of second interconnects,
said first metal layer having a first opening aligned with and larger than said first interconnect such that said first interconnect is disconnected from said first metal layer and one of said first metal layer and said second metal layer having a plurality of second openings, each second opening being aligned with and larger than a second interconnect such that said second interconnect is disconnected from said one of said first metal layer and said second metal layer.

15. The method of claim 14, further comprising:
incorporating said first integrated circuit chip into a multiple chip module stacked adjacent to a second integrated circuit chip comprising a plurality of second devices;
electrically connecting a signal line to said first interconnect at said first opening; and
electrically connecting said second devices to said second interconnects at said second openings such that said first device receives power from said signal line at said first opening and divides said power for application to said second devices at said second openings.

16. The method of claim 14, further comprising:
incorporating said first integrated circuit chip into a multiple chip module stacked adjacent to a second integrated circuit chip comprising a second device;
electrically connected a plurality of signal lines to said second interconnects at said second openings; and
electrically connecting said second device to said first interconnect at said first opening such that said first device receives power from said signal lines at said second openings and combines said power for application to said second device at said first opening.

17. The method of claim 14, said forming of said first device comprising:
   forming said first metal layer on said first side and said second metal layer on said second side;
   after said forming of said first metal layer on said first side and said second metal layer on said second side, forming said first opening in said first metal layer and said second openings in said second metal layer;
   forming, for said interconnects and using a laser drill, round vias extending vertically through said first metal layer, said substrate and said second metal layer; and
   depositing a conductor to at least line said vias.

18. The method of claim 14, said forming of said first device comprising:
   forming said second metal layer on said second side;
   forming said second openings in said second metal layer;
   forming, for said interconnects, round vias extending vertically through said substrate to said second metal layer;
   depositing a conductor to at least line said vias;
   after said depositing of said conductor, forming said first metal layer on said first side; and
   forming said first opening in said first metal layer.

19. The method of claim 14, said forming of said first integrated circuit chip comprising forming additional devices positioned laterally adjacent to said first device.

20. The method of claim 14, said forming of said first device comprising:
   forming a plurality of rectangular vias extending vertically into said substrate from said first side toward said second side, wherein, for said first interconnect and for each of said second interconnects, multiple rectangular vias are patterned so as to form walls of a polygon-shaped interconnect and wherein, for each of said third interconnects, a single rectangular via is patterned;
   depositing a conductor to at least line said plurality of rectangular vias;
   forming said first metal layer on said first side;
   forming said first opening in said first metal layer aligned above said first interconnect;
   grinding said second side of said substrate to expose bottom surfaces of said plurality of rectangular vias;
   forming said second metal layer on said second side; and
   forming said second openings in said second metal layer aligned below said second interconnects.

* * * * *